(12) United States Patent
Schnabel (10) Patent No.: US 6,744,641 B2
(45) Date of Patent: Jun. 1, 2004

(54) ELECTROMAGNETIC INTERFERENCE GASKET

(75) Inventor: John David Schnabel, Fareham (GB)

(73) Assignee: Sun Microsystems, Inc., Santa Clara, CA (US)

( * ) Notice: Subject to any disclaimer, the term of this patent is extended or adjusted under 35 U.S.C. 154(b) by 0 days.

(21) Appl. No.: 10/166,514

(22) Filed: Jun. 10, 2002

(65) Prior Publication Data
US 2003/0227762 A1 Dec. 11, 2003

(51) Int. Cl.$^7$ ................................. H05K 9/00
(52) U.S. Cl. .............. 361/818; 361/816; 361/800; 174/35 R; 174/35 GC
(58) Field of Search .................. 361/212, 220, 361/724–728, 752, 740–741, 747, 753, 756, 759, 796, 799–802, 814, 816, 818; 174/35 R, 35 GC, 35 MS, 35 TS, 50, 51; 439/607, 608, 609, 927; 277/920–921, 653, 233, 234, 227, 630, 645; 211/41.17, 26.2

(56) References Cited

U.S. PATENT DOCUMENTS

| | | | | |
|---|---|---|---|---|
| 4,623,752 A | * | 11/1986 | Steen et al. | 174/35 GC |
| 4,820,885 A | * | 4/1989 | Lindsay | 174/35 GC |
| 4,864,076 A | * | 9/1989 | Stickney | 174/35 GC |
| 4,866,213 A | * | 9/1989 | Lindsay | 174/35 GC |
| RE33,256 E | * | 7/1990 | Busby | 174/35 GC |
| 5,001,297 A | * | 3/1991 | Peregrim et al. | 174/35 GC |
| 5,107,070 A | * | 4/1992 | Benn, Sr. et al. | 174/35 GC |
| 5,142,101 A | * | 8/1992 | Matsuzaki et al. | 174/35 GC |
| 5,231,246 A | * | 7/1993 | Benson et al. | 174/35 R |
| 5,523,527 A | * | 6/1996 | Mann et al. | 174/35 GC |
| 5,524,908 A | * | 6/1996 | Reis | 277/233 |
| 6,116,615 A | * | 9/2000 | Trehan | 277/630 |
| 6,147,300 A | | 11/2000 | Li et al. | |
| 6,201,182 B1 | * | 3/2001 | Sosnowski | 174/35 GC |
| 6,225,555 B1 | * | 5/2001 | Sosnowski | 174/35 GC |
| 6,320,120 B1 | * | 11/2001 | Van Haaster | 174/35 GC |
| 6,444,900 B1 | | 9/2002 | Casey | |
| 6,534,706 B1 | | 3/2003 | Rapp et al. | |

* cited by examiner

Primary Examiner—Phuong T. Vu
(74) Attorney, Agent, or Firm—Meyertons Hood Kivlin Kowert & Goetzel, P.C.; B. Noël Kivlin

(57) ABSTRACT

An elongate gasket that can be placed on an electrical assembly in order to reduce electromagnetic interference, comprises (i) an elongate deformable strip (1) of electrically conductive material that has been folded along its length to form an arcuate cross-sectional profile; and
(ii) an attachment arrangement (10, 12) to secure the gasket onto the component;

At least one of the strip and the attachment arrangement is folded at an end region (30) thereof over the end of the other of the strip and the attachment arrangement in order to provide a smoothly varying longitudinal profile at the end of the gasket. This form of gasket allows components such as modules, to be inserted into recesses in an assembly by sliding along the gasket without damage to the gasket or causing it to be shifted.

12 Claims, 5 Drawing Sheets

ELECTROMAGNETIC INTERFERENCE GASKET

BACKGROUND OF THE INVENTION

The present invention relates to gaskets for protecting electronics equipment from electromagnetic interference.

There is often a need to protect electronics equipment from electromagnetic interference (EMI) caused by background electromagnetic radiation generated by other electrical equipment, telecommunications broadcasts, electrical discharges and the like, and it is common to provide electronics equipment with EMI gaskets for this purpose. The EMI gasket should clearly be electrically conductive and is therefore usually made from metal, but should also be deformable so that it will take up the profile of whatever component is being placed in contact with it so as to reduce the size of any gaps that may occur between the gasket and the component and therefore reduce the passage of electromagnetic radiation through such gaps.

Many designs of EMI gasket have been made for this purpose, and the gaskets may be continuous or discrete, the discrete gaskets being designed to fit a defined size and shape of aperture in an electronics module or assembly, while the continuous gaskets are "cut-to-length" designs in which a length of a gasket strip is cut off and attached to the equipment around any aperture to be protected.

This invention is primarily concerned with continuous EMI gaskets. One form of gasket that is available on the market is so-called "EMI finger strip" in which a length of metal strip is formed having an array of transversely extending slits along a longitudinally extending central region. Longitudinally extending lateral edge regions may be folded under the central region, and the central region may be bent, along the length of the strip, to give the strip an arcuate cross-sectional profile. This form of gasket is very flexible about its transverse axes because the transversely extending slits extend over substantially the entire width of the gasket (once the edge regions have been folded underneath the central region) so that the slits can open out to accommodate bending of the strip.

This form of EMI gasket can be very effective for reducing levels of unwanted electromagnetic radiation once the various components of the assembly have been located in place, but it can be difficult in certain circumstances to locate the various parts of the assembly with respect to one another about the gasket. No major problem is normally encountered if one part of the assembly is moved into position in a direction perpendicular to the gasket so that it is moved until it comes into contact with the gasket and a small degree of deformation of the gasket will allow the component to be seated correctly with respect to the gasket. However, problems often occur where one of the parts of the assembly must be moved along the gasket during installation. For example, where one module of an assembly must be inserted into a recess in a partition wall, and finger strip is located on the two opposing edges of the recess along which the module slides during insertion, the leading edges of the module will often catch or snag on the transverse slits in the finger strip, thereby reducing the effectiveness of the gasket at best or at worst damaging the gasket.

For this reason a somewhat different version of EMI gasket is offered. In this version of gasket no transverse slits are provided at the central region of the gasket (forming the apex of the gasket in transverse cross-section) and transverse slits are instead provided at the sides of the gasket. This form of gasket is less flexible than the finger strip, but it does allow components to be inserted into the assembly by sliding them along the gasket. As with the finger strip, one or both longitudinally extending lateral edge portions may be folded under the central portion and an attachment arrangement for attaching the gasket to the assembly or component may be enclosed within the gasket so formed. Such a form of gasket will allow, in many cases, insertion of a module into an assembly by sliding it along the gasket. However, a problem still exists by virtue of the abrupt start of the gasket. The profile of the gasket does not change along its length and at each end the gasket starts abruptly at its full height. This can still therefore cause snagging of the leading edge of a component such as a module on the front end of the gasket with the result that the gasket may buckle as the component is inserted. Alternatively, the strip forming the gasket may be pushed off any attachment arrangement that is used to retain it on the electronics arrangement.

SUMMARY OF THE INVENTION

According to one aspect the invention provides an elongate gasket that can be placed on an electrical assembly in order to reduce electromagnetic interference, which comprises (i) an elongate deformable strip of electrically conductive material that has been folded along its length to form an arcuate cross-sectional profile; and
(ii) an attachment arrangement to secure the gasket onto the component;

wherein at least one of the strip and the attachment arrangement is folded at an end region thereof in order to provide a smoothly varying longitudinal profile at the end of the gasket.

The deformable strip or the attachment arrangement may be folded about the other at one end of the gasket only or at both ends depending on circumstances.

The gasket according to the invention has the advantage that at at least one end region, the longitudinal profile of the gasket will vary smoothly from a fraction of its full height to its full height. Accordingly, it becomes considerably easier to insert a component into the assembly at one end of the gasket and slide the component along the gasket without the leading edge butting up against the front end of the gasket.

In one aspect of the invention, it is possible for the front end of the attachment arrangement (which may itself be in the form of a strip) to be folded over the top of the deformable strip in order to generate the smoothly varying profile. Such an arrangement will leave a free end of the attachment arrangement located on top of the deformable strip and pointing in the direction of insertion of the component. Although this design is not optimal, it will allow insertion of a component by sliding it along the gasket without any significant difficulty. Removal of the component by sliding it along the gasket in the opposite direction, i.e. against the direction of the free end of the attachment arrangement, should not present a difficulty either, because the component is being removed and so no edge of the component, other than a trailing edge, passes over the free end of the attachment arrangement.

In another form, however, the end region of the deformable strip is folded around the end of the attachment arrangement. This form has the advantage that the free end of the deformable strip is tucked away under the attachment arrangement and is therefore less likely to catch on any electronics component as it is being inserted or removed. In order to facilitate folding the end region of the deformable strip around the end of the attachment arrangement, it is possible to form a longitudinally extending tongue at at least one end of the strip that is folded around the end of the attachment arrangement. The tongue is preferably formed in the central region of the deformable strip in the transverse direction which forms the apex of the arcuate cross-sectional profile and has been folded underneath the end of the attachment arrangement. With this form of gasket, it is possible for an end region extending for about 1 to 2 cm to be somewhat flattened and so provide a lead-in region for inserting any components along the gasket.

The gasket may, if desired, be formed from a length of conductive material that has at least one longitudinally extending array of transversely extending slits so that when it is folded along its length to give it an arcuate cross-sectional profile, the transversely extending slits occur along one side edge of the gasket and will enable it to be flexed more easily. If the length of conductive material has two parallel arrays of transversely extending slits that are separated from one another by a region of the conductive material that will form the apex of the arcuate transverse profile, then when the length of conductive material has been folded along its length to form the deformable strip, the slits will occur at both sides of the gasket. As an alternative, arrays of oblique slits may be provided.

The strip is usually provided with a base portion that has been formed by folding at least one longitudinally extending lateral edge portion along the length of the strip. Alternatively it may be formed by folding each lateral edge portion toward the other lateral edge portion along the length of the strip so that an attachment arrangement can be held between the two folded edge portions. The attachment arrangement may take any of a number of forms: it may be formed as a continuous length of a strip that can be cut to the appropriate length. Alternatively, it may be formed as number of discrete attachment devices that can be attached to the electronics assembly at predefined points. Whichever form of attachment arrangement is employed it can be attached to the electrical assembly by bonding or mechanically, for example by means of barbs that are pushed through small holes in the assembly. In one form of gasket that is convenient to use, the attachment arrangement is in the form of a continuous strip that can be cut to length and inserted into an end of the deformable strip of material and slid into it. A number of barbs may be located at predetermined positions along the strip so that the gasket can be attached to the assembly after it has been cut to length and the ends folded simply by pressing it against the assembly at points corresponding to the position of the barbs in the attachment strip and holes in the electrical assembly.

Where the base portion has been formed by folding the lateral edge portions, any slits in the sides of the gasket may extend into the lateral edge portions of the strip that form the base portions either partly so that an inner edge region of the base portions remains continuous, or over the entire width of the base portions. In other cases the slits need not extend into the base portion or only to a very limited extent.

The deformable strip needs to be electrically conductive and deformable, and will normally be formed from a metal. As examples, it may be formed from spring stainless steel or beryllium copper. In addition, it is advantageous for it to be resiliently deformable so that it will adopt its original profile when a component is removed from the electrical assembly, and the gasket will often therefore be formed from a material such as berylium copper. Other parts of the gasket, for instance any attachment strip, may be formed from the same material as the deformable strip, or alternatively, and especially where discrete attachment components are employed, may be made from plastics material.

According to another aspect, the invention provides an elongate gasket that can be placed on an electrical component in order to reduce electromagnetic interference, which comprises:

(i) an elongate deformable strip of electrically conductive material that has been folded along its length to form an arcuate cross-sectional profile; and (ii) an attachment arrangement to secure the gasket onto the component;

wherein the elongate deformable strip can be folded over the end of the attachment arrangement at an end region thereof in order to provide a smoothly varying longitudinal profile at the end of the gasket.

According to yet another aspect, the invention provides an electronics assembly that contains a gasket for reducing electromagnetic interference on an edge or surface thereof, the gasket comprising;

(i) an elongate deformable strip of electrically conductive material that has been folded along its length to form an arcuate cross-sectional profile; and (ii) an attachment arrangement that secures the gasket to the assembly, wherein at least one of the strip and the attachment arrangement is folded at an end region thereof over the end of the other of the strip and the attachment arrangement in order to provide a smoothly varying longitudinal profile at the end of the gasket.

According to a still further aspect, the invention provides a method of providing an electronics assembly with a gasket for reducing electromagnetic interference, which comprises attaching a gasket to one part of the assembly, the gasket comprising an elongate deformable strip of electrically conductive material that has been folded along its length to form an arcuate cross-sectional profile, and an attachment arrangement that secures the gasket to the part of the assembly, wherein at least one of the strip and the attachment arrangement is folded at an end region thereof over the end of the other of the strip and the attachment arrangement in order to provide a smoothly varying longitudinal profile at the end of the gasket, locating a second part of the assembly at the end of the gasket and sliding the second part of the assembly along the gasket in the longitudinal direction thereof until the two parts of the assembly are correctly positioned relative to one another.

BRIEF DESCRIPTION OF THE DRAWINGS

Embodiments of the present invention will now be described in detail with reference to the accompanying drawings, in which corresponding parts are given like reference numbers. In the drawings.

DESCRIPTION OF PARTICULAR EMBODIMENTS

Figures 1, 2:
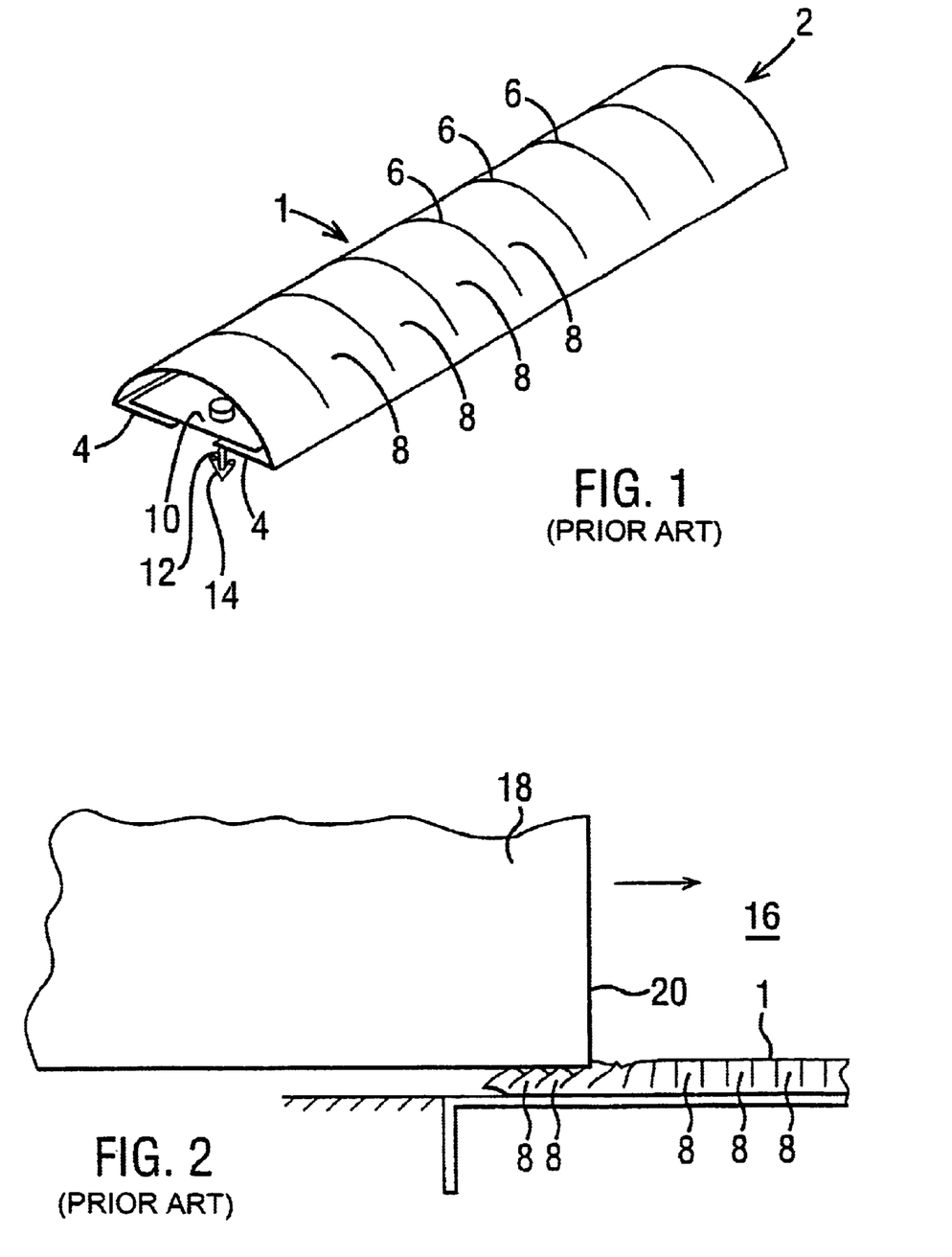
FIG. 1 is an isometric view of one form of conventional gasket.
FIG. 2 is a side view of the gasket of FIG. 1 during insertion of a module in an electrical assembly.

Referring now to the drawings, in which like reference numerals are used to designate corresponding elements, FIG. 1 shows a conventional EMI gasket for electrical equipment. This form of gasket, also called "EMI finger strip" comprises a metal strip 1 that is folded longitudinally along its length to form a central region 2 having a generally arcuate transverse cross-section and has two longitudinally extending lateral edge regions 4 that are folded underneath the central region 2 and form a flat base. The central region 2 of the gasket has a longitudinal array of transverse slits 6 extending across the apex of the arcuate central region 2 that divide the central region into a number of segments 8 of generally "D"-shaped cross-section. A strip 10 of metal of the same length as the metal strip 1 is located within the metal strip 1 between the folded edge regions 4 and the central region 2. The strip 10 has a number of small holes at a regular spacing each of which contains a plastics attachment barb 12 having an arrow-shaped head 14. This form of finger strip can simply be cut to length and pressed onto electronics equipment such as a frame of a racking system which is also provided with an array of small holes for receiving the heads 14 of the barbs 12.

However, if the electronics frame has a recess 16 into which a module is to be inserted by sliding and it is desired to provide protection from electromagnetic interference, such finger strip cannot be employed as can be seen from FIG. 2. Because the front edge of the strip 1 has a rectangular profile in which it is at its full height along its entire length, as a module 18 is inserted into the recess, the leading edge 20 of the module will hit the front of the gasket and cause the segment thereof to fold back. As insertion of the module is continued, each subsequent segment 8 of the gasket that is hit by the leading edge 20 of the module is bent back and a significant degree of damage is caused to the gasket.

This problem cannot be ameliorated by reducing the height of the gasket because the gasket would not then be in compression at all points when the module 18 is installed.

Figure 3:
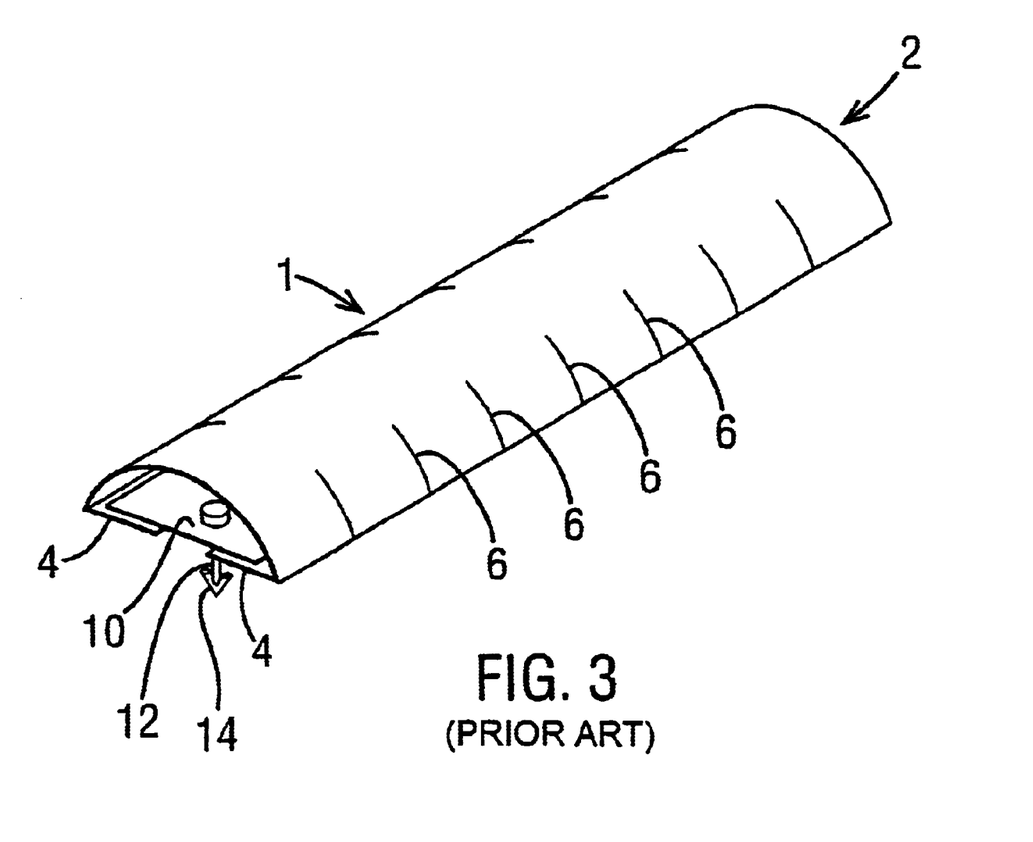
FIG. 3 is an isometric view of another form of conventional gasket.

An alternative form of gasket is shown in FIG. 3 along which components of the electrical equipment can be slid. This form of gasket has generally the same construction as the gasket shown in FIG. 1, and is also formed from a metal strip 1 that is folded longitudinally along its length to form a central region 2 having a generally arcuate transverse cross-section, and has a pair of longitudinally extending lateral edge regions 4 that have been folded together underneath the central region to form a flat base. The gasket also contains an attachment arrangement that comprises a strip of metal that is located within the strip 1 between the lateral edge regions and the central region 2 and is provided with a longitudinal array of regularly spaced barbs 12 for attachment to a frame of electronics equipment. In this form of gasket, however, slits 6 do not extend across the apex of the central region of the gasket, but instead two longitudinally extending arrays of slits 6 are provided that are spaced apart from one another by the central region 2 of the strip 1 which forms the apex of the arcuate transverse cross-section.

Figure 4:
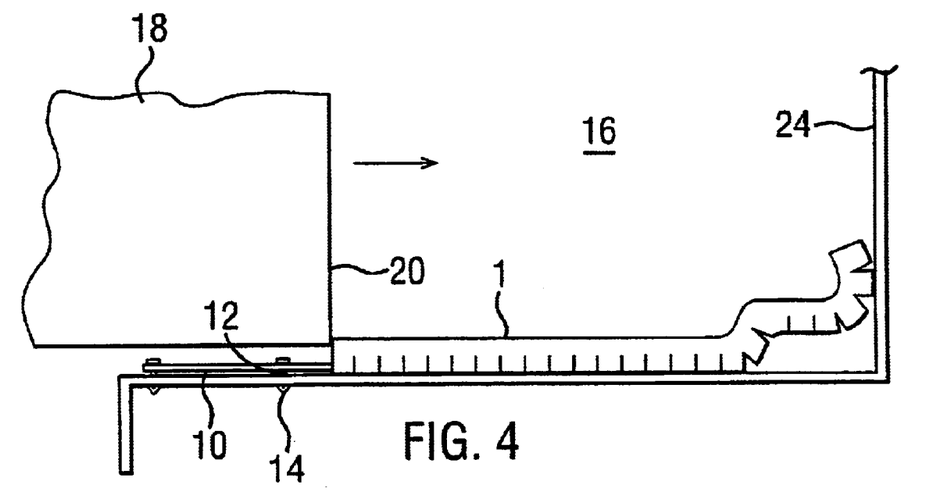
FIG. 4 is a side view of the gasket of FIG. 3 during insertion of a module in an electrical assembly.

This form of gasket can allow insertion of an electrical component such as a module into a recess in the equipment by sliding the component along the central region of the gasket where no slits 6 are formed. It is necessary, however, to flatten the front ends 22 of any gaskets when a component 18 is inserted into the recess, either manually or by manipulation of the component, in order to allow the component to ride over the gasket. This can be difficult in many circumstances, with the result that the leading edge of the component abuts the front end of the gasket and pushes it rearwardly along the attachment strip 10 as shown in FIG. 4. As the module 18 is inserted in the direction of the arrow, if its leading edge 20 hits the end of the gasket, the entire gasket may be pushed rearwardly and will crumple as it slides off the attachment strip 10 and hits any rear wall 24 of the recess 16. Clearly, if this occurs, it will not be possible to provide a functioning gasket or even install the module 18.

Figure 5:
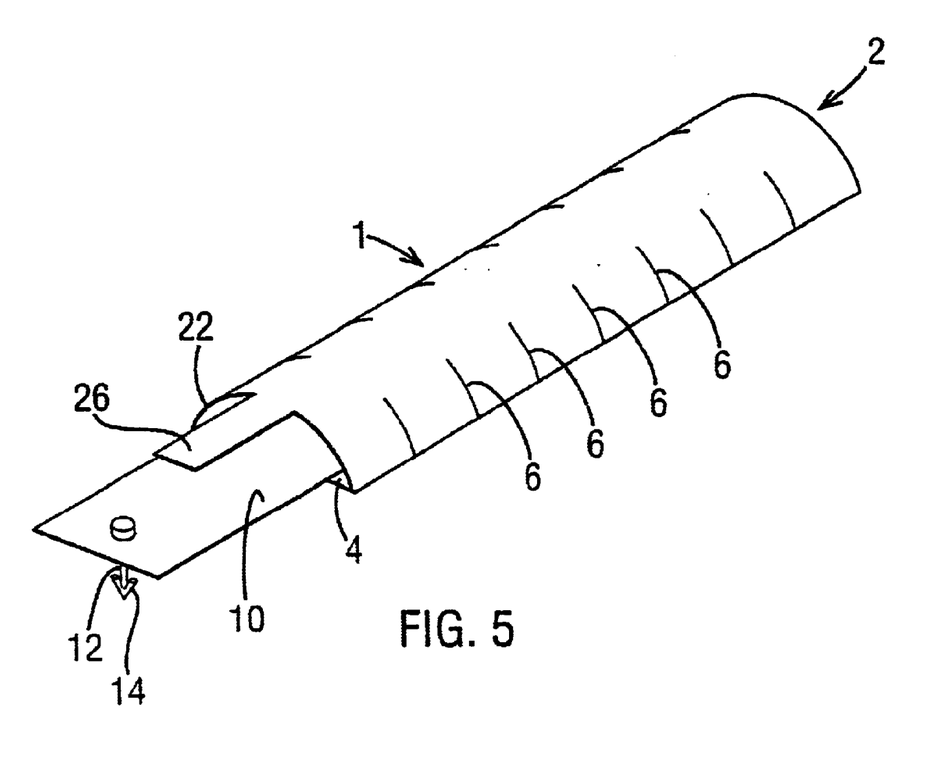
FIG. 5 is an isometric view of a gasket according to the present invention.

FIG. 5 shows one form of gasket in accordance with the present invention. This form of gasket is generally similar to the gasket shown in FIG. 3 and comprises a strip 1. The strip 1 may be formed from any electrically conductive material, for example a metal, that is resiliently deformable for example from beryllium copper. The strip 1 is folded along its length to form a generally arcuate transverse cross-section having a central region 2 forming the apex of the arcuate transverse cross-section. The strip also has a pair of longitudinally extending lateral edge regions 4 that are folded underneath the central region. An attachment strip 10 is located within the deformable strip 1 between the lateral edge regions 4 and the apex of the central region 2, and is provided with an array of regularly spaced barbs 12 for attachment to a frame or other electronics equipment. In FIG. 5 the front end of the attachment strip 10 is shown extending beyond the front end 22 of the deformable strip 1 for the sake of clarity, but it would normally be completely enclosed within the deformable strip 1. The deformable strip 1 also includes a tongue 26 at its front end, and also preferably at its other end (not shown) which can be folded down at the region where it is attached to the front end of the deformable strip 1.

Figure 6:
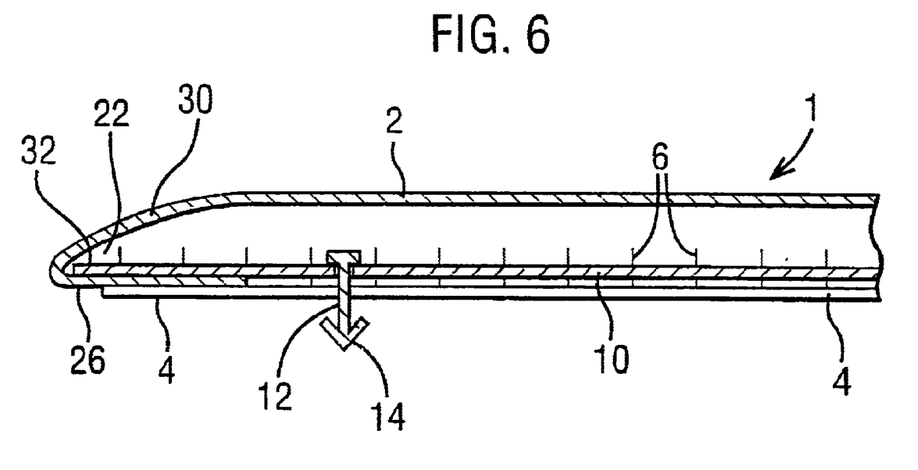
FIG. 6 is a side sectional elevation of the gasket of FIG. 5 ready for attachment to electrical equipment.

FIG. 6 is a longitudinal cross-section of the gasket shown in FIG. 5 with the tongue 26 formed at the front end of the deformable strip 1 folded down and underneath the front end of the attachment strip 10. The tongue 10 may extend, in its folded state, on the outside of the folded lateral edge regions 4, that is to say, so that in use it will be located between the lateral edge regions 4 and any equipment to which it is attached. Alternatively, and as shown in FIG. 6, it may extend, in its folded state, inside the folded lateral edge regions 4, i.e. between the edge regions 4 and the attachment strip 10. The tongue 26 may be provided with a transversely extending crease so that it is biased into its folded state.

Figure 7:
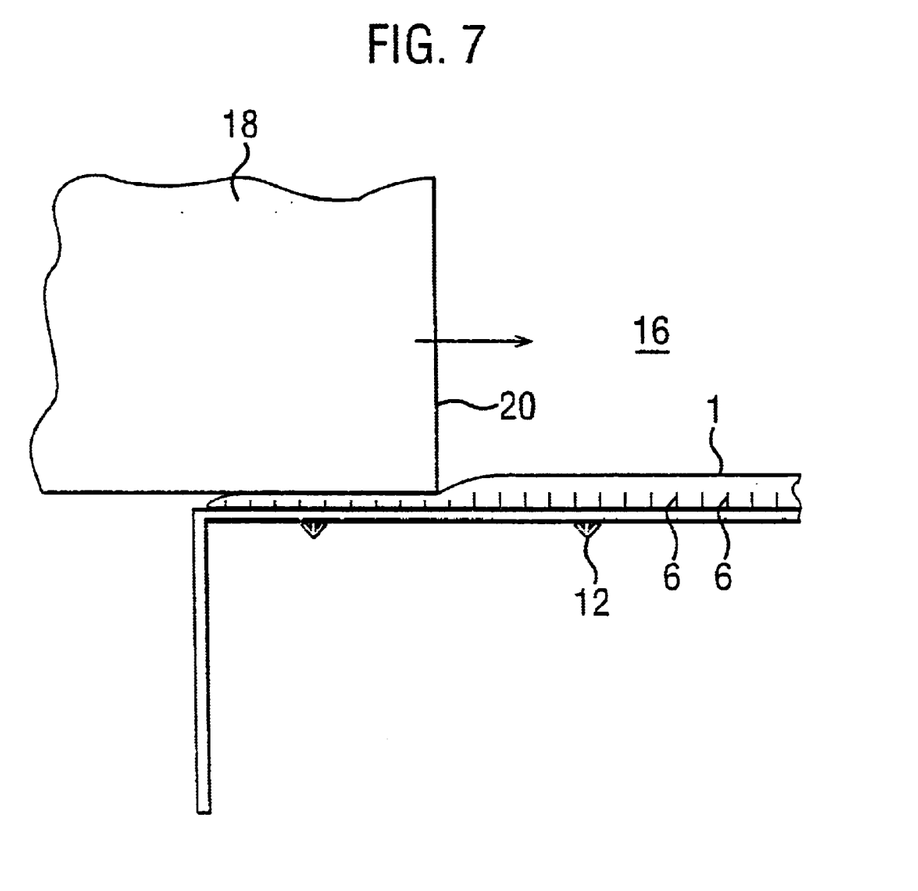
FIG. 7 is a side sectional elevation of the gasket of FIG. 6 during insertion of a module.

When the tongue has been folded underneath the attachment strip, the front region 30 of the gasket is generally flattened and over this region, which may extend from about 1 to 3 cm, the gasket will gradually reach its full height. This front region 30 provides a lead-in region for introduction of an electronics component to be inserted into the recess 16 by sliding it along the gasket as shown in FIG. 7, after which, further introduction of the component or module 18 will cause progressively further regions of the gasket 1 to be compressed to allow it to slide over the gasket.

The attachment arrangement may be substantially the same length as the deformable strip so that the tongue 26 is folded around the front end 32 thereof. Thus, when the component 18 is inserted into the recess 16 and hits the front end region 30 of the deformable strip, there will inevitably be some force on the deformable strip 1 applied by the component 18 that attempts to push it along the attachment arrangement in the direction of insertion of the component 18. This movement of the deformable strip is resisted by the front end 32 of the attachment strip abutting the inwardly directed surface of the tongue 26 forming the front end of the gasket. The deformable strip is not then able to slide any further along the attachment strip 10.

Figure 8:
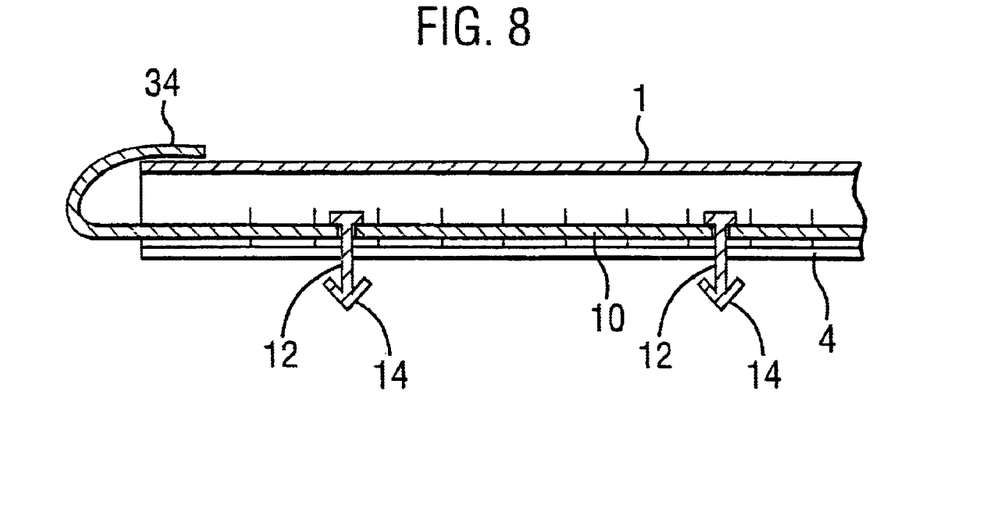
FIG. 8 is a side sectional elevation of a second form of gasket according to the present invention.
Figure 9:
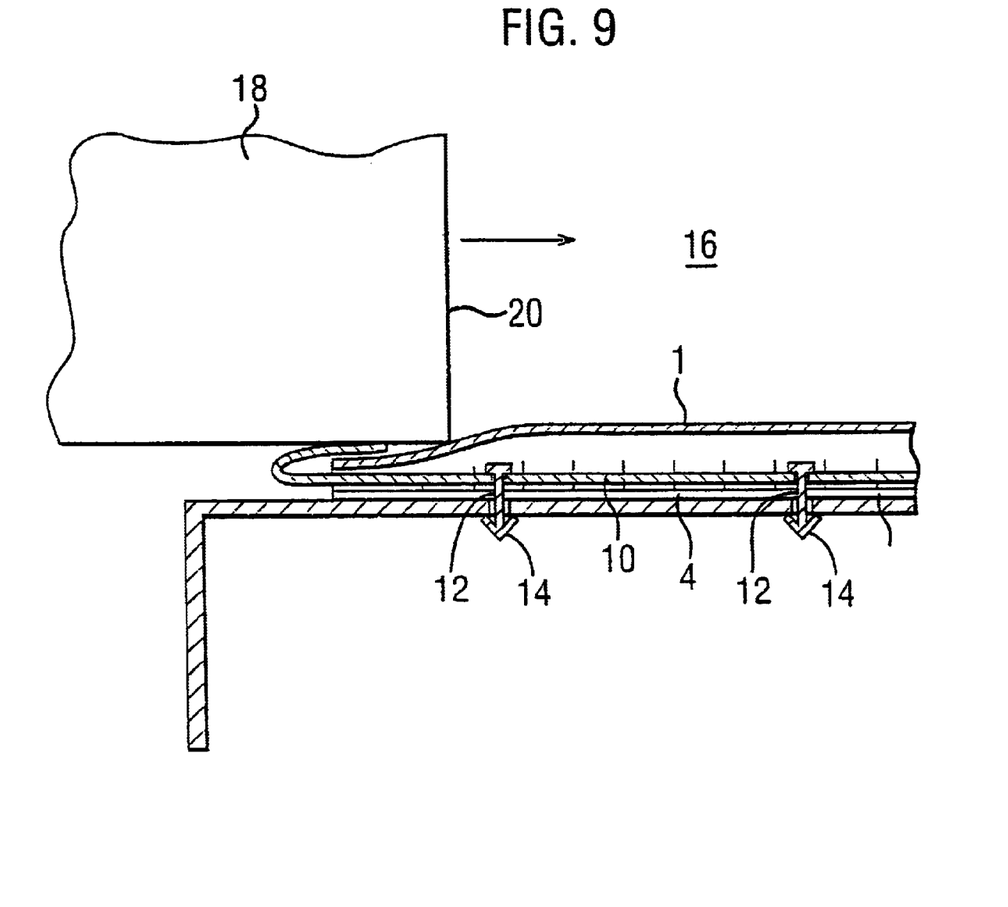
FIG. 9 is a side sectional elevation of the gasket of FIG. 8 with a module of the electrical equipment in place thereon.

An alternative form of gasket according to the invention is shown in FIGS. 8 and 9. In this form of gasket, the deformable strip 1 has generally the same form as that shown in FIG. 3, but the attachment strip 10 is longer than the deformable strip 1 and extends initially beyond the front end of the deformable strip 1. That part 34 of the attachment strip 10 that extends beyond the front end of the deformable strip 1 is bent upwards and around the front end of the deformable strip 1 so that about 1 to 3 cm of the attachment strip 10 lie on top of the front end of the deformable strip. The front end of the deformable strip 1 is shown with the same height as the remainder of the strip 1 for the sake of clarity, but if the front portion 34 of the attachment strip is folded backwards along a transverse crease, the front region of the deformable strip 1 that lies underneath the folded back part 34 of the attachment strip and for a short distance beyond will have a reduced height.

In use, when a component 18 is inserted into a recess 16 by sliding it along the gasket, the leading edge 20 will ride over the folded back region 34 of the attachment strip 10 thereby compressing the front end of the deformable strip lying beneath it. Further movement forward of the component in the direction of the arrow will cause the leading edge 20 of the component to slide over the deformable strip 1 as shown in FIG. 10, but any tendency of the strip 1 to move backwards under the action of insertion of the component 18 will be resisted by friction between the central region 2 of the deformable strip 1 and the folded back parts of the attachment strip between which it is sandwiched.

If it is desired to remove the module 18, it can simply be removed by sliding it along the gasket 1 out of the recess 16 in a direction opposite to the arrow. Because the leading edge (in the direction of removal) of the component 18 will already be lying over the folded back region 34 of the attachment strip, the component 18 can be removed without it snagging the end 36 of the folded back region.

If this form of gasket is employed, it is preferred to use it where only one end has the attachment strip folded over the deformable metal strip. It is preferred for the rear end of the gasket, that is to say, the end that is directed away from the component 18 as it is being inserted, not to be terminated by folding a region 34 of the attachment strip 10 over the top of the deformable metal strip since the end 36 of the attachment strip 10 at the far end of the gasket will be oriented toward the component 18 being inserted and will snag on its leading edge 20.

The scope of the present disclosure includes any novel feature or combination of features disclosed therein either explicitly or implicitly or any generalisation thereof irrespective of whether or not it relates to the claimed invention or mitigates any or all of the problems addressed by the present invention. The applicant hereby gives notice that new claims can be formulated to such features during the prosecution of this application or of any such further application derived therefrom. In particular, with reference to the appended claims, features from dependent claims can be combined with those of the independent claims and features from respective independent claims can be combined in any appropriate manner and not merely in the specific combinations enumerated in the claims.

What is claimed is:

1. An elongate gasket that can be placed on an electrical assembly in order to reduce electromagnetic interference, which comprises:
   (i) an elongate deformable strip of electrically conductive material that has been folded along its entire length to form an arcuate cross-sectional profile;
   (ii) an attachment arrangement to secure the gasket onto the electrical assembly;
   wherein the strip has a longitudinally extending tongue at at least one end thereof that is folded around the end of the attachment arrangement in order to provide a smoothly varying longitudinal profile at the end of the gasket.

2. A gasket as claimed in claim 1, wherein the tongue is formed in the central region of the strip and has been folded underneath the end of the attachment arrangement which allows formation of the apex of the arcuate cross-sectional profile.

3. A gasket as claimed in claim 1, wherein the strip has transversely extending slits along at least one side edge region thereof in order to enable the strip to be flexed.

4. A gasket as claimed in claim 1, wherein the strip has a base portion that has been formed by folding at least one longitudinally extending side edge portion along the length of the strip.

5. A gasket as claimed in claim 4, wherein the base portion has been formed by folding each side edge portion toward the other side edge portion along the length of the strip.

6. A gasket as claimed in claim 4, wherein the attachment arrangement is located within the strip by folding each side edge portion of the strip about the attachment arrangement.

7. The gasket as claimed in claim 1, wherein the deformable strip is substantially "D"-shaped in cross-section.

8. A gasket as claimed in claim 1, wherein the attachment arrangement is in the form of an elongate strip along which the deformable strip of electrically conductive material is slid.

9. A gasket as claimed in claim 1, wherein the deformable strip is resiliently deformable.

10. An elongate gasket that can be placed on an electrical component in order to reduce electromagnetic interference, which comprises:
    (i) an elongate deformable strip of electrically conductive material that has been folded along its entire length along a longitudinal direction to form an arcuate cross-sectional profile that extends from one end of the deformable atm to an opposite end; and
    (ii) an attachment arrangement to secure the gasket onto the component;
    wherein the attachment arrangement has a tongue that extends beyond the length of the strip and that is folded such that the tongue covers said arcuate cross-sectional profile at said one end of the strip in order to provide a smoothly varying longitudinal profile at the end of the gasket.

11. An electronics assembly that contains a gasket for reducing electromagnetic interference on an edge or surface thereof, the gasket comprising:
    (i) an elongate deformable strip of electrically conductive material that has been folded along its entire length along a longitudinal direction to form an arcuate cross-sectional profile that extends from one end of the deformable strip to an opposite end; and (ii) an attachment arrangement that secures the gasket to the assembly, wherein the attachment arrangement has a tongue that extends beyond the length of the strip and that is folded such that the tongue covers said arcuate cross-sectional profile at said one end of the strip in order to provide a smoothly varying longitudinal profile at the end of the gasket.

12. A method of providing an electronics assembly with a gasket for reducing electromagnetic interference, which comprises:

attaching a gasket to one part of the assembly, the gasket comprising an elongate deformable strip of electrically conductive material that has been folded along its entire length along a longitudinal direction to form an arcuate cross-sectional profile that extends from one end of the deformable strip to an opposite end, and an attachment arrangement that secures the gasket to the part of the assembly, wherein the attachment arrangement has a tongue that extends beyond the length of the strip and that is folded such that the tongue covers said arcuate cross-sectional profile at said one end of the strip in order to provide a smoothly varying longitudinal profile at the end of the gasket;

locating a second part of the assembly at the end of the gasket; and sliding the second part of the assembly along the gasket in the longitudinal direction thereof until the two parts of the assembly are correctly positioned relative to one another.

* * * * *

UNITED STATES PATENT AND TRADEMARK OFFICE
CERTIFICATE OF CORRECTION

PATENT NO. : 6,744,641 B2
DATED : June 1, 2004
INVENTOR(S) : Schnabel

It is certified that error appears in the above-identified patent and that said Letters Patent is hereby corrected as shown below:

Column 8,
Line 54, please replace "atm" to -- strip --.

Signed and Sealed this

Seventh Day of September, 2004

JON W. DUDAS
*Director of the United States Patent and Trademark Office*